(12) United States Patent
Liao et al.

(10) Patent No.: US 9,553,073 B2
(45) Date of Patent: Jan. 24, 2017

(54) CHIP STACK STRUCTURE USING CONDUCTIVE FILM BRIDGE ADHESIVE TECHNOLOGY

(71) Applicant: LINGSEN PRECISION INDUSTRIES, LTD., Taichung (TW)

(72) Inventors: Chien-Ko Liao, Taichung (TW); Tzu-Chih Lin, Taichung (TW)

(73) Assignee: LINGSEN PRECISION INDUSTRIES, LTD, Taichung (TW)

( * ) Notice: Subject to any disclaimer, the term of this patent is extended or adjusted under 35 U.S.C. 154(b) by 0 days.

(21) Appl. No.: 14/256,776

(22) Filed: Apr. 18, 2014

(65) Prior Publication Data

US 2015/0187735 A1      Jul. 2, 2015

(30) Foreign Application Priority Data

Dec. 27, 2013   (TW) ............................ 1021048867 A

(51) Int. Cl.
| H01L 25/065 | (2006.01) |
| H01L 23/498 | (2006.01) |
| H01L 23/00 | (2006.01) |

(52) U.S. Cl.
CPC ....... *H01L 25/0657* (2013.01); *H01L 23/4985* (2013.01); *H01L 23/49838* (2013.01); *H01L 24/40* (2013.01); *H01L 25/0652* (2013.01); H01L 24/32 (2013.01); H01L 2224/29111 (2013.01); H01L 2224/32225 (2013.01); H01L 2224/32245 (2013.01); H01L 2224/37147 (2013.01); H01L 2224/40106 (2013.01); H01L 2224/40135 (2013.01); H01L 2224/40227 (2013.01); H01L 2224/73263 (2013.01); H01L 2224/83815 (2013.01); H01L 2225/06579 (2013.01); H01L 2225/06589 (2013.01)

(58) Field of Classification Search
CPC .................. H01L 2924/00; H01L 2224/73265; H01L 2924/00014; H01L 2224/48227; H01L 2224/32225; H01L 2924/00012; H01L 2924/0002
See application file for complete search history.

(56) References Cited

U.S. PATENT DOCUMENTS

| 5,579,208 A * | 11/1996 | Honda et al. ................. 361/813 |
| 2006/0189033 A1* | 8/2006 | Kim .................... H01L 23/3114 438/109 |
| 2013/0134583 A1* | 5/2013 | Tsukiyama et al. .......... 257/737 |

* cited by examiner

*Primary Examiner* — Tony Tran
(74) *Attorney, Agent, or Firm* — Muncy, Geissler, Olds & Lowe, P.C.

(57) ABSTRACT

A chip stack structure using conductive film bridge adhesive technology comprises a substrate, a first chip, at least one bridge element, a conductive film, and a second chip. The first chip is electrically connected to a first electrode of the substrate. The at least one bridge element has a first bridge surface and a second bridge surface at two ends, and the first bridge surface and the second bridge surface are electrically connected to the first chip and a second electrode of the substrate, respectively. The conductive film is electrically connected to the first bridge surface of the at least one bridge element. The second chip is stacked and electrically connected to the conductive film. Thus, the structure of the present invention not only facilitates the ease of stacking the chips but also increases the effectiveness of the chips heat dissipation and ability of withstanding electrical current.

4 Claims, 3 Drawing Sheets

CHIP STACK STRUCTURE USING CONDUCTIVE FILM BRIDGE ADHESIVE TECHNOLOGY

BACKGROUND OF THE INVENTION

1. Field of the Invention

The present invention is related to chip stack structure, especially related to a chip stack structure using conductive film bridge adhesive technology.

2. Description of Related Art

Since a single chip cannot withstand the electrical current of an entire system, it is generally required to use two or more chips to overcome this problem, however, the substrate area will be have to be increased due to placing the chips horizontally. As shown in FIG. 1, an integrated power module has a plurality of separated chips 1 disposed on a single substrate 2, and then welding wires 3 are bonded to electrically connect the chips with each other. However, the overall size of the package increases because the chip 1 becomes more dense in this kind of structure.

With the advancement of technology, electronic products tend towards miniaturization and providing high performance to meet the needs of customers. In order to improve the performance and the capacity rate of a single package structure, three-dimensional (3D) package is widely adopted in the present day. Two or more chips 1 are stacked in a single package structure in order to provide a 3D package with compactly stacked and interconnected chips 1. As shown in FIG. 2, a conventional chip stack structure 4 is disposed with a plurality of chips, which are stacked up and down on a substrate 2. In the chip stack structure 4, a first chip 1a is adhered to the substrate 2 by an adhesive, and a plurality of first welding wires 3a are bonded and electrically connected to first pads 5a on the surface of the first chip 1a and contacts 6 on the substrate 2. Then, a second chip 1b is disposed on the first chip 1a. The adhesive 7 is applied between the first chip 1a and the second chip 1b in advance to adhere the second chip 1b to the first chip 1a and partially covers the first welding wires 3a. The thickness of the adhesive 7 exceeds the arc height of the first welding wires 3a in case of the first welding wires 3a make contact with the second chip 1b. After stacking the second chip 1b, a plurality of second welding wires 3b are bonded and electrically connected to second pads 5b of the second chip 1b and the contacts 6 on the substrate 2. Both this chip stack structure 4 and the one recited above use wire bonding for electrical connection between chips so there isn't any effective heat dissipation structure between the chips 1a, 1b. When the heat can't be timely dissipated, the effectiveness of the chips will decrease due to the increase in temperature. Moreover, the adhesive 7 in this case is easily interfered with due to high temperatures and welding wires, and there will be voids gathered in the adhesive 7. Once the number of voids is reaches a critical capacity, the adhesive bond of the adhesive 7 will be greatly reduced, which leads to the chips 1a, 1b not being able to be stacked successfully.

To sum up the above, the conventional chip stack structure has the above drawbacks and needs to be improved.

BRIEF SUMMARY OF THE INVENTION

The main objective of the present invention is to provide a chip stack structure using conductive film bridge adhesive technology. The chip stack structure not only facilitates the case of stacking the chips but also increases the effectiveness of the chips heat dissipation and ability of withstanding electrical current.

In order to achieve the above objective, the present invention utilizes of the chip stack structure using conductive film bridge adhesive technology. The chip stack structure comprises a substrate, a first chip, at least one bridge element, a conductive film and a second chip. The substrate comprises a first electrode and a second electrode. The first chip is electrically connected to the first electrode of the substrate. The at least one bridge element has a first bridge surface and a second bridge surface at two ends, and the first bridge surface and the second bridge surface are electrically connected to the first chip and the second electrode of the substrate, respectively. The conductive film is electrically connected to the first bridge surface of the at least one bridge element. The second chip is stacked and electrically connected to the conductive film.

The first chip has a first connecting surface and a second connecting surface, the first connecting surface is disposed on the first electrode of the substrate, and the first bridge surface of the at least one bridge element is connected to the second connecting surface.

The substrate further comprises a third electrode, the second bridge surface of the at least one bridge element is electrically connected to the third electrode.

The conductive film is a tin film.

The first bridge surface and the second bridge surface of the at least one bridge element are flat surfaces.

The at least one bridge element is a copper film.

Thus, the structure of the present invention not only facilitates the ease of stacking the chips but also increases the effectiveness of the chips heat dissipation and ability of withstanding electrical current.

In order to facilitate the examiner to have a further knowledge and understanding of the present objectives of the present invention, technical features, and the effects, the embodiments corresponding to drawings are illustrated as follows.

In order to facilitate the examiner to have a further understanding of components, features, and objectives thereof, the embodiments corresponding to drawings are illustrated as follows. However, the following description is an embodiment provided only for illustrating the technical content and features of the present invention. Various simple modifications, replacements, or omitted components made by people skilled in this art without violating the spirit of the present invention after they understand the technical content and features should fall within the scope the present invention intends to protect.

DETAILED DESCRIPTION OF THE INVENTION

In order to describe the structure, technical features, and effects of the present invention in detail, a preferred embodiment corresponding to following drawings is illustrated as follows.

Figure 1:
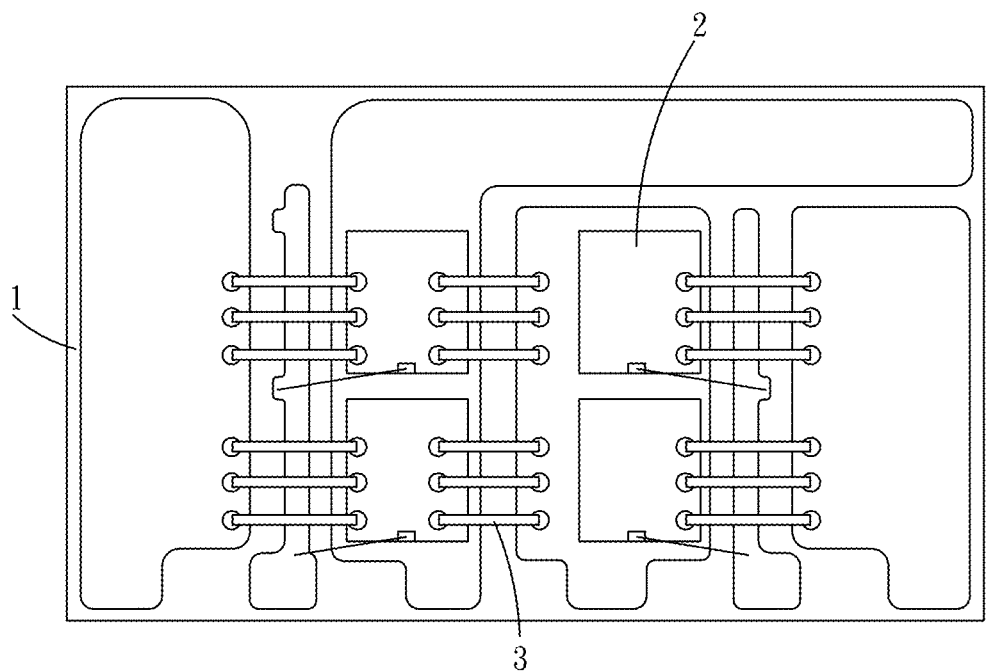
FIG. 1 is a top view of a conventional chip package structure, and it mainly shows that aluminum wires electrically connect the chips and the substrate by wire bonding in the conventional manner.
Figure 2:
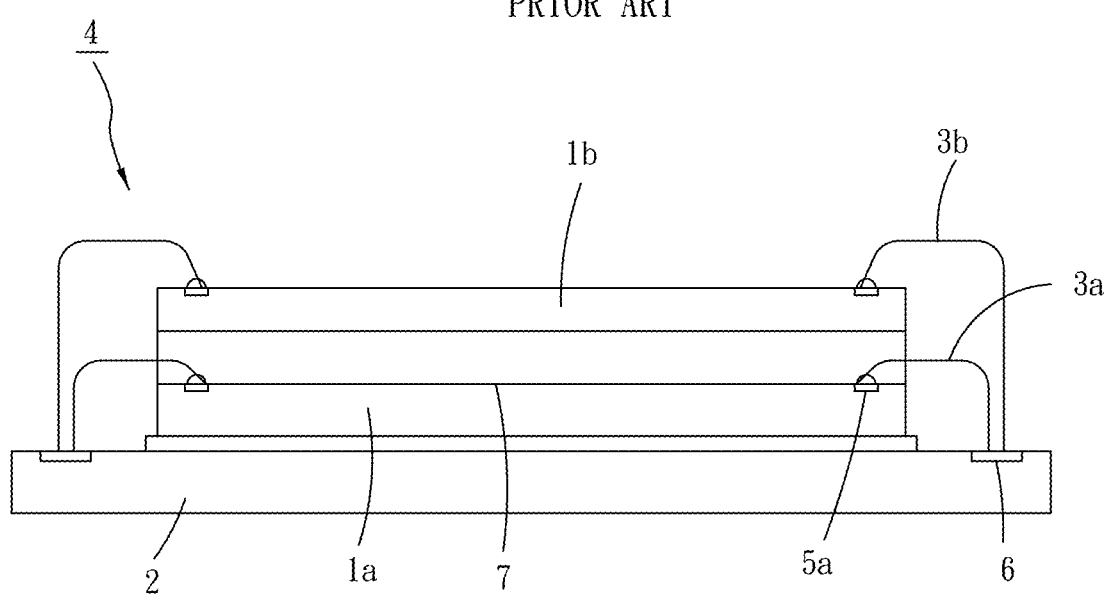
FIG. 2 is a cross-sectional view of a conventional chip stack structure, which mainly shows the arrangement relationship between the first chip and the second chip.
Figure 3:
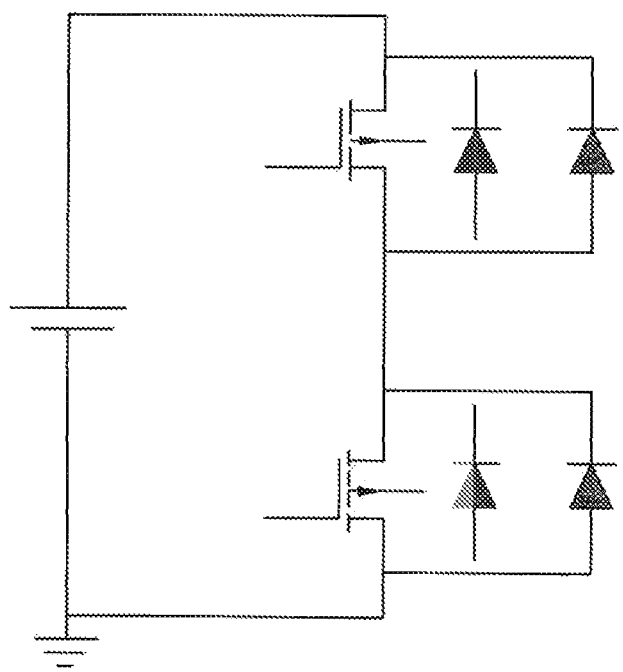
FIG. 3 is a circuit diagram of a half bridge module.
Figure 4:
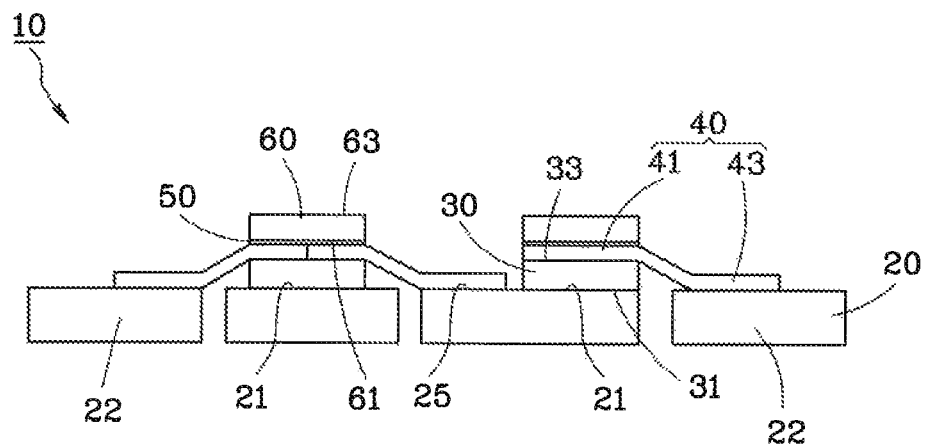
FIG. 4 is a cross-sectional view of a chip stack structure using conductive film bridge adhesive technology of a preferred embodiment of the present invention, and it mainly shows the aspect that a plurality of chip stack structures.
Figure 5:
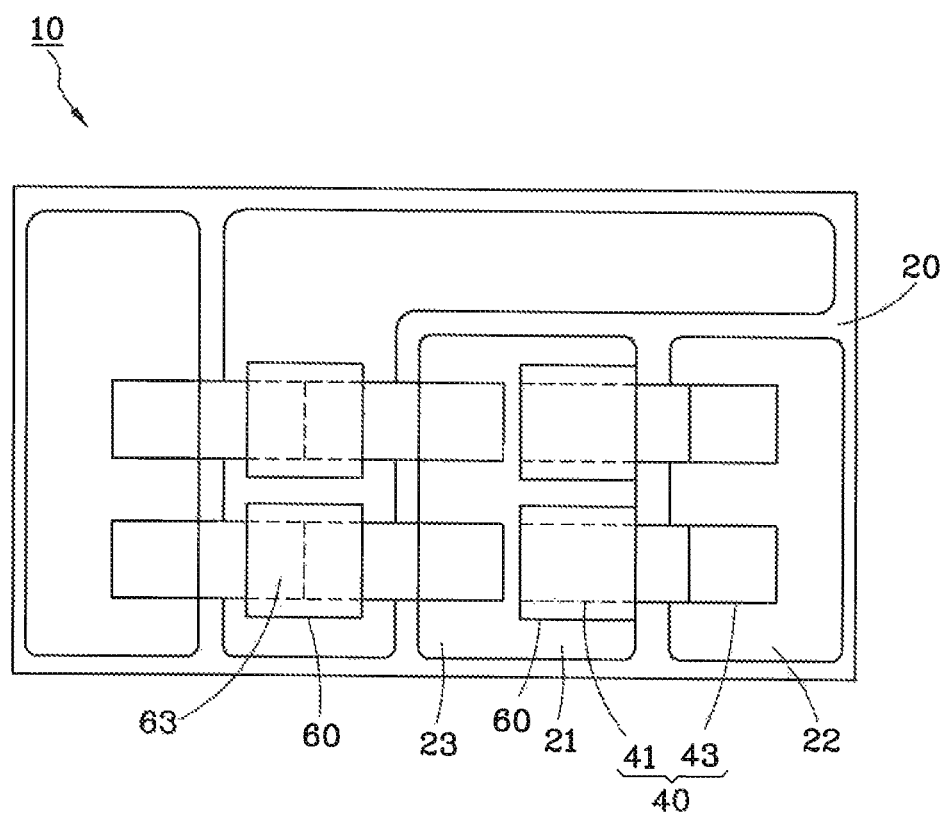
FIG. 5 is a top view of a chip stack structure using conductive film bridge adhesive technology of a preferred embodiment of the present invention, and it mainly shows the change area after the plurality of chip are stacked.

Please refer to FIG. 3 to FIG. 5, which show a chip stack structure 10 using conductive film bridge adhesive technology of a preferred embodiment of the present invention. The chip stack structure 10 comprises:

A substrate 20, which comprises a first electrode 21 and a second electrode 23.

A first chip 30, which is electrically connected to the first electrode 21 of the substrate 20.

At least one bridge element 40, which is a copper film and has a first bridge surface 41 and a second bridge surface 43 at two ends of the at least one bridge element 40. The first bridge surface 41 and the second bridge surface 43 are electrically connected to the first chip 30 and the second electrode 23 of the substrate 20, respectively. In the preferred embodiment of the present invention, the first bridge surface 41 and the second bridge surface 43 of the at least one bridge element 40 are flat surfaces. Since the bridge element 40 has a comparatively large conductive area, it replaces the conventional aluminum wire to improve the effect of withstanding electrical current.

A conductive film 50, which is a tin film and is electrically connected to the first bridge surface 41 of the at least one bridge element 40. Thereby, the conductive film 50 can be comparatively stably disposed on the first bridge surface 41 of the at least one bridge element 40.

A second chip 60, which is stacked and electrically connected to the conductive film 50. Since the conductive film 50 is a sheet-like structure, the second chip 60 can be placed plainly. Furthermore, because the second chip 60 conducts the first chip 30 and the at least one bridge element 40 through the tin conductive film 50, heat generated by the first and second chips 30, 60 can be quickly and efficiently dissipated to prevent overall performance degradation due to being unable to dissipate the heat in a timely manner.

It should be noted that the conductive film 50 of the chip stack structure of the present invention is a tin film. Therefore, there won't be any voids generated in the conductive film 50 during the melting process when the vacuum reflow furnace is welding. This way helps the adhesion and prevents the second chip 60 from peeling.

In addition, the numbers of chip stack layers of the chip stack structure 10 using the conductive film bridge adhesive technology and the bridge element 40 are not limited to the numbers of the abovementioned. The capacity of the structure can be improved by interlacing and stacking a plurality of the bridge elements 40, a plurality of the conductive films 50, and a plurality of the second chip 60 on the first chip 30. Or, as shown FIGS. 4 and 5, the substrate 20 further has a third electrode 25. The second surface 43 of the at least one second bridge element 40 is electrically connected to the third electrode 25. The first chip 30 has a first surface 31 and a second connecting surface 33. The first connecting surface 31 is disposed on the first electrode 21 of the substrate 20. The first bridge surface 41 of the at least one bridge element 40 is connected to the second connecting surface 33. The second chip 60 has a first connecting surface 61 and a second connecting surface 63. The first connecting surface 61 of the second chip 60 is connected to the conductive film 50. The second connecting surface 63 of the second chip 60 can be continuously stacked with the bridge element 40 and the conductive film 50 as the aforesaid structure in order for provide various chip stack structures to achieve different circuit layouts.

In conclusion, the chip stack structure using conductive film bridge adhesive technology of the present invention utilizes the first bridge surface and the second bridge surface, which are both flat and have a large conductive area, of the bridge element, to improve the effectiveness of withstanding electrical current and to provide the conduction film to be disposed plainly. Thereby, the heat generated by each of the chips will be quickly and effectively dissipated to prevent overall performance degradation due to being unable to dissipate the heat in a timely manner. Moreover, because the conductive film is a tin film, there won't be any void generated in the conductive film during the melting process when the vacuum reflow furnace is welding. This way supports the adhesive bond and prevents the second chip from peeling.

The components disclosed in the abovementioned embodiment of the present invention are only illustrative and not intended to limit the scope of the present invention. Substitutions or changes of other equivalent elements should be covered by the claims of the present invention.

What is claimed is:

1. A chip stack structure using conductive film bridge adhesive technology, comprising:
   a substrate comprising a first electrode and a second electrode;
   a first chip, arranged on the substrate and directly connected to the first electrode of the substrate;
   at least one bridge element having a first bridge surface and a second bridge surface at two ends, the first bridge surface and the second bridge surface being directly connected to the first chip and the second electrode of the substrate, respectively;
   a conductive film, stacked and directly connected to a top surface of the first bridge surface of the at least one bridge element; and
   a second chip, stacked and directly connected to a top surface of the conductive film,
   wherein a bottom surface of the first chip has a first connecting surface and a top surface of the first chip has a second connecting surface, the first connecting surface is disposed on the first electrode of the substrate, and the first bridge surface of the at least one bridge element is connected to the second connecting surface; and
   wherein the substrate further comprises a third electrode, the second bridge surface of the at least one bridge element is directly connected to the third electrode.

2. The chip stack structure using conductive film bridge adhesive technology in claim 1, wherein the conductive film is a tin film.

3. The chip stack structure using conductive film bridge adhesive technology in claim 1, wherein the first bridge surface and the second bridge surface of the at least one bridge element are flat surfaces.

4. The chip stack structure using conductive film bridge adhesive technology in claim 1, wherein the at least one bridge element is a copper film.

* * * * *